United States Patent [19]

Mumola

[11] Patent Number: 5,292,400
[45] Date of Patent: Mar. 8, 1994

[54] METHOD AND APPARATUS FOR PRODUCING VARIABLE SPATIAL FREQUENCY CONTROL IN PLASMA ASSISTED CHEMICAL ETCHING

[75] Inventor: Peter B. Mumola, Huntington, Conn.

[73] Assignee: Hughes Aircraft Company, Los Angeles, Calif.

[21] Appl. No.: 854,718

[22] Filed: Mar. 23, 1992

[51] Int. Cl.⁵ .................. B44C 1/22; H01L 21/306; C03C 15/00
[52] U.S. Cl. .................................. 156/643; 156/657; 156/662; 156/345
[58] Field of Search .............. 156/643, 646, 657, 662, 156/345, 626; 118/720, 723, 729, 50.1, 620; 134/1; 427/3.8; 204/192.32, 192.37, 298.31, 298.33, 298.35

[56] References Cited

U.S. PATENT DOCUMENTS

| | | | |
|---|---|---|---|
| 4,411,733 | 10/1983 | Macklin et al. | 156/345 X |
| 4,482,419 | 11/1984 | Tsukada et al. | 156/345 |
| 4,680,086 | 7/1987 | Thomas et al. | 204/298.33 X |
| 4,964,940 | 10/1990 | Auvert et al. | 156/345 |
| 5,009,738 | 4/1991 | Gruenwald et al. | 156/345 |

Primary Examiner—William A. Powell
Attorney, Agent, or Firm—Michael W. Sales; Wanda K. Denson-Low

[57] ABSTRACT

A reactor 10 having a vacuum housing 30 which encloses a plurality of plasma chambers 14a, 14b is used to perform local plasma assisted chemical etching on an etchable substrate 12. The chambers 14a, 14b are movable and are sized according to the removal material footprint desired. Radio frequency driven electrodes 20a, 20b and gas diffuser/electrodes 22a, 22b have the same diameter as the chambers 14a, 14b. The substrate 12 is mounted on a substrate holder 44 which also acts as the other electrode. The holder 44 is mounted on an X-Y positioning table 46. A process gas is flowed into a preselected chamber with rf power so as to disassociated the process gas into a plasma. The plasma chambers 14a, 14b may be scanned over the substrate surface while the gap between the chambers and the substrate is varied to yield a desired etch profile.

17 Claims, 2 Drawing Sheets

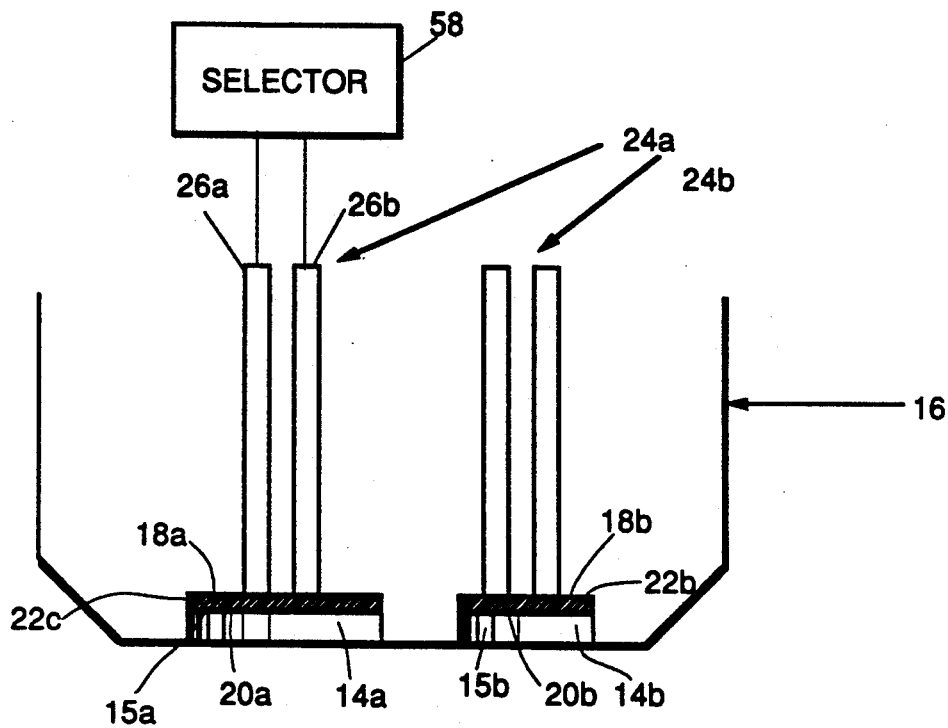
FIG. 2.
FIG. 3.
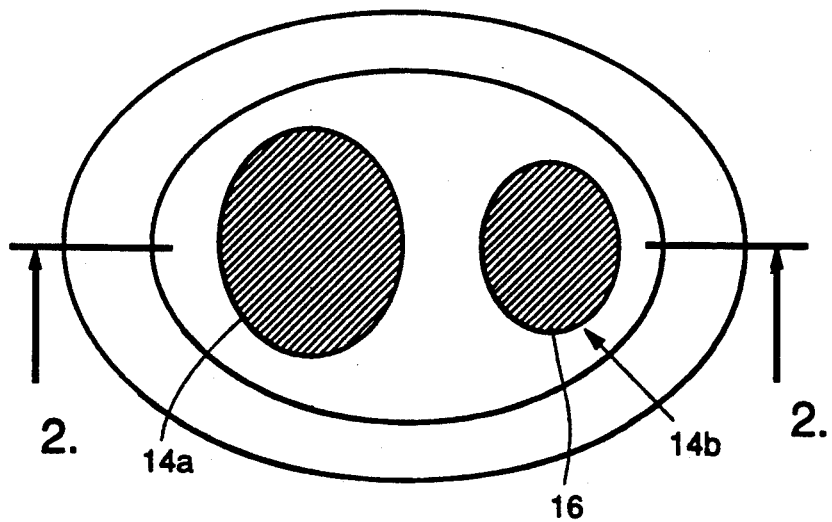

METHOD AND APPARATUS FOR PRODUCING VARIABLE SPATIAL FREQUENCY CONTROL IN PLASMA ASSISTED CHEMICAL ETCHING

FIELD OF THE INVENTION

The present invention relates to a method and apparatus for performing plasma assisted chemical etching of a substrate so as to allow the correction of errors on the surface thereof. More particularly, the present invention relates to a method and apparatus for achieving broad spatial bandwidth surface error correction of a substrate by plasma assisted chemical etching.

DESCRIPTION OF THE PRIOR ART

Methods and apparatus for substrate surface processing such as wafer thinning and optical figuring of such materials as silicon-on-insulator (SOI), gallium arsenide, germanium, fused silica, quartz, silicon carbide and diamond by local plasma assisted chemical etching of the substrate surface have been disclosed in U.S. patent application Ser. No. 07/696,897, entitled "System For Removing Material From A Wafer" filed on May 7, 1991, U.S. patent application Ser. No. 07/807,535 entitled "Method And Apparatus for confinement of a Plasma Precision Shaping of Surfaces of Substrates and Films" filed on Dec. 13, 1991. Both applications disclose a plasma assisted chemical etching reactor chamber having a single radio frequency (rf) electrode and process gas supply.

A method for determining the etching strategy (dwell time over a point on the surface of a substrate and removal tool footprint size) of a substrate surface for correcting errors in thickness profiles of films utilizing an apparatus having a single electrode has been disclosed in U.S. patent application Ser. No. 07/807,544 filed on Dec. 13, 1991, entitled "Method To Determine Tool Paths For Thinning And Correcting Errors in Thickness Profiles Of Films". All of these applications are commonly owned by the present assignee.

It is reasonably well known that the error correction bandwidth of a plasma assisted chemical etching process is inversely proportional to the electrode diameter (footprint). In most practical applications of plasma assisted chemical etching, it is desirable to achieve both high material removal of surface errors at low spatial frequencies and lower material removal for surface errors at high spatial frequencies. The prior art methods and apparatus disclosed by the above referenced applications have a limited spatial bandwidth error correction capability due to the use of a single fixed rf electrode and process gas supply. The present invention improves upon the methods and apparatus of the prior art in that it allows the achievement of broad spatial bandwidth error correction by selection of an appropriate etching footprint size without breaking the vacuum environment of the plasma assisted chemical etching reactor apparatus and without additional moving parts within the vacuum environment. The present invention eliminates the need for multiple measurement/etch cycles and associated handling of a substrate during the etching process.

SUMMARY OF THE PRESENT INVENTION

The present invention relates to a plasma assisted chemical etching reactor apparatus for correcting errors in the surface of a substrate. The reactor apparatus has a special rf head including two or more electrodes with associated gas and power feeds housed in a single insulating member. Each electrode has a different diameter so that, by the selection of the appropriate electrode, sequential etching operations can remove both high and low frequency errors from the surface of the substrate.

One objective of the present invention is to allow precise material removal from the surface of a substrate by plasma assisted chemical etching.

Another objective of the present invention is to provide a material removal tool with broad spatial bandwidth error correction capability.

Other objects and advantages of the present invention will become apparent to those skilled in the art from the following detailed description read in conjunction with the attached drawings and claims appended hereto.

DESCRIPTION OF THE DRAWINGS

FIG. 2 is a side view of a plasma assisted chemical etching rf electrode of the present invention.

FIG. 3 is a bottom view of the same plasma assisted chemical etching rf electrode of the present invention.

DETAILED DESCRIPTION OF THE INVENTION

Figure 1:
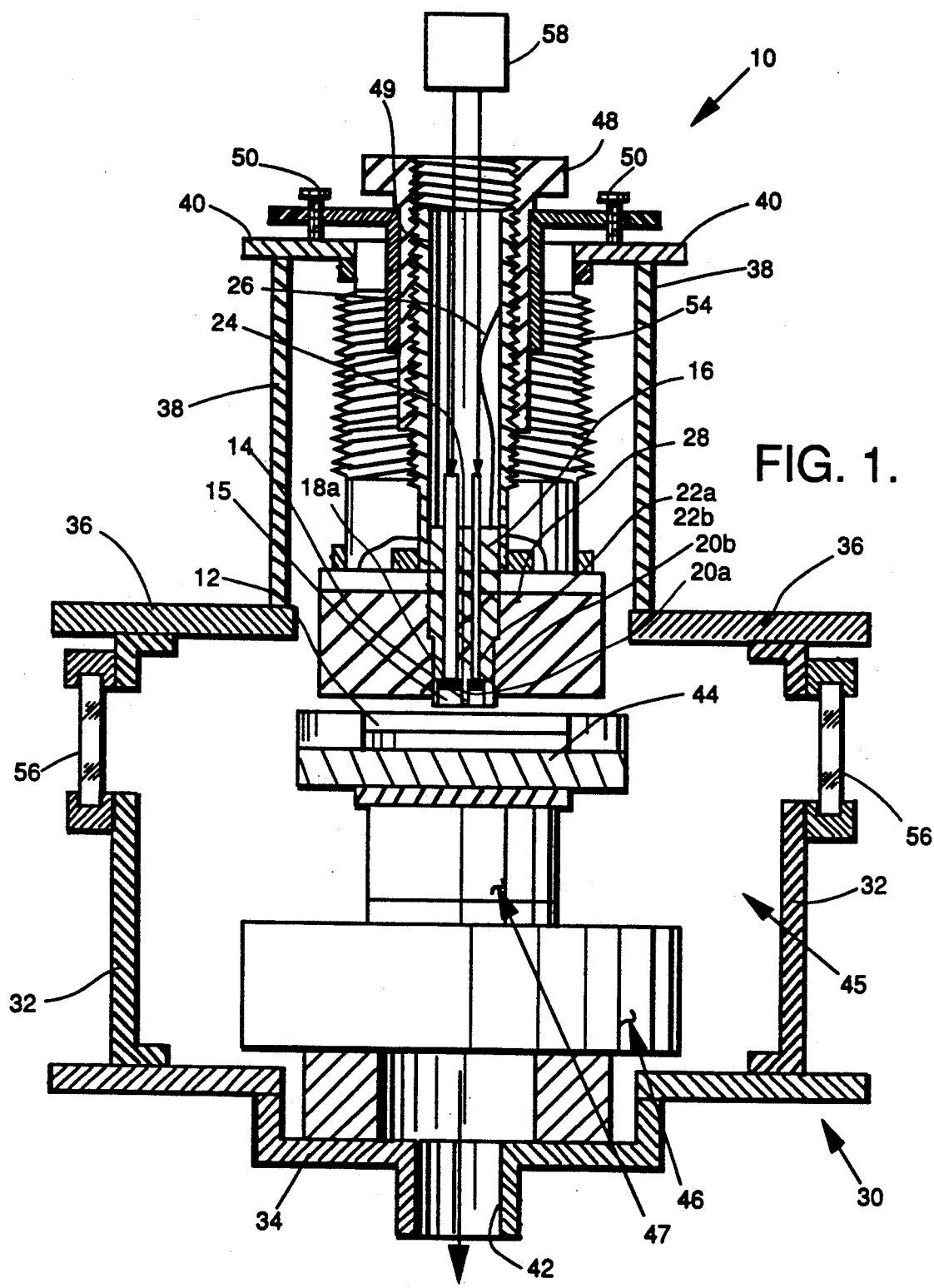
FIG. 1 is a schematic diagram of a reactor system capable of confining a plasma etch region to a local area on a substrate.

The method and apparatus of the present invention provides a tool for the removal of high and low spatial frequency errors from the surface of a substrate material by the local application of reactive species of a plasma to the substrate surface by a plasma assisted chemical etching reactor. FIG. 1 shows the plasma assisted chemical etching reactor apparatus of the present invention. Referring to FIG. 1, the apparatus of the present invention comprises a reactor 10 designed for transporting a process gas into two or more regions over the surface of a substrate where an rf field is applied to disassociate the gas into reactive components. FIGS. 2 and 3 illustrate an rf head 11 used with the reactor 10 to provide a broad spatial bandwidth error correcting apparatus. The head 11 has two plasma chambers 14a, 14b, each having walls 15a, 15b defined by a first dielectric insulator 16 and a ceiling 18a, 18b defined by a gas diffuser/electrodes 20a, 20b. The diffusers/electrodes may be fabricated from any electrically conductive material which permits the flow of gas into the plasma chambers. Porous silicon carbide and stainless steel (316) have been used as diffuser/electrodes. Because the first dielectric 16 comprises the walls of each plasma chamber 14a, 14b, the first dielectric 16 must be fabricated from a non-contaminating material. Above each chamber 14a, 14b, an rf driven electrode 22a, 22b is affixed between the ceiling 18a, 18b and the first insulator 16. Electrode 22a is larger than electrode 22b so as to provide the broad error correcting bandwidth. The exact size of each electrode is determined by the bandwidth desired and other considerations such as material removal rates (mm$^3$/minute). The size of the larger electrode 22a, and thus larger material removal tool, is chosen so as to remove the lowest spatial frequency components of surface error on the substrate. The size of the smaller electrode 22b, and thus smaller material removal tool, is determined so as to address the higher spatial frequency errors up to a practical limit of approximately 0.5 mm$^{-1}$.

Two process gas feed tubes 24a, 24b run through the first dielectric insulator 16 to supply process gas to the diffuser/electrodes 20a, 20b in the plasma chambers 14a, 14b respectively during the etching operation. Two rf conductors 26a, 26b connect the rf driven electrodes 22a, 22b to an rf field power source. A second dielectric insulator 28 surrounds the first insulator 16 and is dimensioned so as to essentially cover substrate 12 thus preventing plasma formation outside of the plasma chambers 14a, 14b. The components of the reactor 10, are enclosed in a vacuum housing 30 comprising a first set of walls 32 extending from a base 34 to a mid-ceiling 36 and a second set of walls 38 extending to a top ceiling flange 40.

During operation, a vacuum is applied through a vacuum outlet 42 at the bottom of the vacuum housing 30. The etchable substrate 12, located adjacently below the plasma chambers 14a and 14b during etching, is supported by a substrate holder 44 which also acts as a second electrode having its potential preferably at electrical ground. The substrate holder may also have a means (not shown) to control the temperature of the substrate thereon.

The substrate holder 44 is mounted to an apparatus 45 for two-dimensional translation which allows precise placement of the localized etching reaction on the surface of the substrate 12. The apparatus 45 for two dimensional translation may be for example, a commercially available X-Y positioning table. The X-Y table, or other such translation apparatus, translates the substrate in a plane which is orthogonal to the vertical dimension of plasma chambers 14a and 14b as can be seen from FIG. 1. The reactor 10 has a threaded tube 48 connected to a reactor support means 49 which interfaces with the threaded tube. The tube 48 may be rotated in a clockwise or counter clockwise fashion so as to allow adjustment of the distance between the plasma chambers 14a and 14b and the surface of the substrate 12. In the embodiment illustrated, the distance between the plasma chamber and the substrate may be adjusted in the approximate range of 1 to 10 mm.

The reactor also has kinematic mounting means having three screws 50 equally spaced on a circle, each of which nest into a V-groove (not shown) on the top ceiling flange 40. This means allows adjustment of the angle of the terminal end 52 of the plasma chamber with respect to the surface of the substrate 12.

While the present embodiment described above provides a means for positioning the plasma chambers 14a, 14b with respect to the surface of the substrate 12, other adaptations such as permanently fixing the plasma chamber assembly and providing three-dimensional and multi-angular positioning of the substrate by a three-dimensional and multi-angular translation stages may be readily substituted. In fact, one preferred embodiment has a fixed reactor configuration so that the rf power, gas and coolant to the plasma reactor can be easily interfaced at atmosphere.

The reactor system further comprises a bellows 54 attached between the ceiling flange 40 of the vacuum housing 30 and the second dielectric insulator 28 so as to provide a means for vacuum sealing the reactor 10 while the plasma chamber assembly is allowed relative movement within the reactor. A plurality of viewports 56 are provided for observation of the reaction.

Only one of the plasma chambers 14a, 14b is selected for plasma assisted chemical etching of the surface of the substrate at any given time by selector 58. In one embodiment, the selector 58 comprises a relay actuated coaxial switch connected between a source of rf power and the rf power conductors 26a, 26b. The switch applies rf power to either of the electrodes 22a, 22b. Thus, switching from electrode 22a to electrode 22b or from electrode 22b to electrode 22a can be accomplished instantly during the etching of a substrate by the appropriate selection of rf power conductor 26a or 26b of the desired electrode. The selector apparatus 58 is located outside of the vacuum housing 30. Thus, broad spatial bandwidth is achieved by the selection of the electrode having the appropriate diameter.

If a broader bandwidth is desired additional electrodes with gas feeds and rf power leads can be used. If the isolation by the first insulator 16 is insufficient for an embodiment having two or more electrodes, separate rf heads may be used, each having a single electrode housed therein.

Thus, it can be appreciated that the present invention provides a means having broad spatial bandwidth for precision shaping of the surface of a substrate. This invention further provides a novel means for fabricating SOI wafers and structures, and for preparing any or all of the following uniform, thin, flat, smooth and damage free crystalline substrates for various types of semiconductor device fabrication.

What is claimed is:

1. An rf head for a plasma assisted chemical etching reactor, said rf head comprising:
   a dielectric insulator having a plurality of cavities therein, and wherein each cavity occupies a different volume of said dielectric insulator;
   a plurality of electrodes, wherein an electrode is positioned within each cavity;
   a plurality of process gas feed tubes, wherein each process gas feed tube is connected between a supply of process gas and one of the plurality of cavities; and
   a plurality of rf power conductors, wherein each conductor is connected between a supply of rf power and an electrode positioned within a cavity.

2. An rf head for a plasma assisted chemical etching reactor, said rf head comprising:
   a plurality of dielectric insulators, wherein each dielectric insulator has a cavity therein, and wherein each cavity occupies a different volume;
   a plurality of electrodes, wherein an electrode is positioned within each cavity;
   a plurality of process gas feed tubes, wherein each process gas feed tube is connected between a supply of process gas and one of the plurality of cavities; and
   a plurality of rf power conductors, wherein each conductor is connected between a supply of rf power and an electrode positioned within a cavity.

3. A material removal tool for performing plasma assisted chemical etching reactions on the surface of a substrate comprising a reactor having:
   a housing;
   a first dielectric insulator positioned within the housing having a plurality of cavities for performing a local plasma etching reaction about a localized region of a substrate, and wherein each cavity occupies a different volume within the insulator.
   means for selectively supplying each cavity with a flow of process gas;

means for selectively providing the process gas within each cavity with rf power so as to generate a plasma therein;

a second dielectric insulator positioned within the housing and around the first dielectric insulator, said second dielectric insulator extending outward from the first dielectric insulator so as to insulate conductive and proximate surfaces, and thereby facilitating extinction of any plasma outside each cavity;

means for supporting the substrate; and means for adjusting the position of each cavity with respect to said substrate surface.

4. The material removal tool of claim 3, wherein the means for selectively supplying rf power to a cavity includes a first electrode and an electrically conductive rf gas diffuser/electrode positioned within the cavity, and a second electrode positioned outside the cavity so that the substrate is positioned between the first and second electrodes so as to complete an electrical circuit for supplying rf power to the process gas within the selected cavity.

5. The material removal tool of claim 4, wherein the first electrode having upper and lower surfaces is positioned so that the upper surface is in contact with the ceiling surface of the cavity and the rf gas diffuser/electrode, having an upper and lower surface is positioned so that its upper surface is in contact with the lower surface of the first electrode.

6. The material removal tool of claim 5, wherein the upper and lower surface areas of the first electrode have approximately the same area and approximately the same planar geometry as the surface of the ceiling of the cavity.

7. The material removal tool of claim 5, wherein the upper and lower surface areas of the electrically conductive gas diffuser/electrode have approximately the same area and approximately the same planar geometry as the surface of the ceiling of the cavity.

8. The material removal tool of claim 4, wherein the electrically conductive gas diffuser/electrode is fabricated from porous silicon carbide.

9. The material removal tool of claim 4, wherein the electrically conductive gas diffuser/electrode is fabricated from stainless steel (316).

10. The material removal tool of claim 4, wherein the second electrode is maintained substantially at ground potential.

11. The material removal tool of claim 3, wherein the means for adjusting the position of a cavity with respect to said substrate surface in the orthogonal direction comprises an x-y positioning table.

12. The material removal tool of claim 3, wherein said housing includes means for applying a vacuum to the housing to remove reaction product and excess process gas.

13. The material removal tool of claim 3, further comprising extending the first dielectric insulator defining the walls of each cavity a predetermined amount beyond the surface of the second dielectric proximate to the substrate surface so as to create a region of high plasma and low reactive gas flow conductance circumferentially adjacent to a site where plasma etching is occurring.

14. A material removal tool for performing confined plasma assisted chemical etching reactions on the surface of a substrate comprising a reactor having:

a first dielectric insulator positioned within the housing and wherein said insulator has plurality of plasma chambers for performing a local plasma etching reaction about a localized region of a substrate;

means for selectively supplying a plasma chamber of said plurality with a flow of process gas including a gas diffuser/electrode;

means for selectively providing the process gas within a selected plasma chamber with rf power so as to generate a plasma therein, and wherein said means includes a first electrode positioned within each plasma chamber, an electrically conductive rf gas diffuser/electrode, and a second electrode positioned outside the plasma chamber so that the substrate is positioned between the first and second electrodes so as to complete an electrical circuit for supplying rf power to the process gas within the plasma chamber;

a second dielectric insulator positioned within the housing and around the first dielectric insulator, said second dielectric insulator extending outward from the first dielectric insulator so as to insulate conductive and proximate surfaces, and thereby facilitating extinction of any plasma outside the selected plasma chamber, and extending downward toward the substrate surface a distance shorter than the first dielectric insulator so as to allow the first dielectric insulator to create a region of high plasma and reactive flow impedance circumferentially adjacent to a site where plasma etching is occurring so that plasma outside the region is extinguished;

means for supporting the substrate; and an X-Y positioning table means for adjusting the position of said substrate surface with respect to the selected plasma chamber in an orthogonal direction.

15. A method for local precision figuring, flattening or smoothing of a substrate or film with a plasma assisted chemical etching apparatus having a plurality of plasma chambers comprising the steps of:

mounting an etchable substrate surface to an electrode;

selecting a plasma chamber for performing plasma assisted chemical etching;

positioning said preselected plasma chamber over a spot on the surface of the substrate, the precise position of the chamber dictated by the etching profile desired;

feeding a process gas stream into a feed inlet of an rf driven gas diffuser/electrode within said preselected plasma chamber;

applying rf power to an electrode within said preselected the plasma chamber to create an rf electric field within the preselected plasma chamber for decomposing the process gas into a plasma; and controlling the area of etching and the profile of etching by relative movement between the substrate and said preselected plasma chamber.

16. The method of claim 15, wherein the area and the profile of etching is controlled by moving the substrate in two or more directions with respect to a fixed preselected plasma chamber.

17. The method of claim 15, wherein the area and profile of etching is controlled by moving the preselected plasma chamber in two or more directions with respect to a fixed substrate.

* * * * *